United States Patent
Nygren

(10) Patent No.: US 7,102,418 B2
(45) Date of Patent: Sep. 5, 2006

(54) METHOD AND APPARATUS FOR PRODUCING A REFERENCE VOLTAGE

(75) Inventor: Aaron Nygren, München (DE)

(73) Assignee: Infineon Technologies AG, Munich (DE)

( * ) Notice: Subject to any disclaimer, the term of this patent is extended or adjusted under 35 U.S.C. 154(b) by 79 days.

(21) Appl. No.: 10/889,370

(22) Filed: Jul. 12, 2004

(65) Prior Publication Data
US 2005/0057294 A1   Mar. 17, 2005

(30) Foreign Application Priority Data
Jul. 14, 2003   (DE)   ................ 103 31 829

(51) Int. Cl.
*H03K 3/01* (2006.01)
(52) U.S. Cl. .............. 327/530; 327/336
(58) Field of Classification Search ........... 327/63–65, 327/67–69, 70–73, 215–218, 299, 336, 530, 327/82, 87, 89
See application file for complete search history.

(56) References Cited

U.S. PATENT DOCUMENTS

| | | | |
|---|---|---|---|
| 3,737,790 A * | 6/1973 | Brown | 327/339 |
| 5,736,875 A * | 4/1998 | Sakamoto et al. | 327/74 |
| 6,201,822 B1 | 3/2001 | Okayasu | 372/38 |
| 6,278,312 B1 * | 8/2001 | Dabral et al. | 327/310 |
| 6,313,708 B1 * | 11/2001 | Beaulieu | 331/17 |
| 6,388,506 B1 * | 5/2002 | Voo | 327/536 |
| 6,484,268 B1 * | 11/2002 | Tamura et al. | 713/600 |
| 6,549,081 B1 * | 4/2003 | Le et al. | 331/57 |
| 6,781,438 B1 * | 8/2004 | Nygren | 327/530 |
| 2002/0098818 A1* | 7/2002 | Yokogawa et al. | 455/255 |
| 2003/0193358 A1 | 10/2003 | Nygren | 327/185 |

OTHER PUBLICATIONS

Soda, M. et al., "A 2.5Gb/s One-Chip Receiver Module for Gigabit-To-The-Home (GTTH) System," IEEE 1998 Custom Integrated Circuits Conference, pp. 273-276, (1999).

* cited by examiner

*Primary Examiner*—Terry D. Cunningham
*Assistant Examiner*—Thomas J. Hiltunen
(74) *Attorney, Agent, or Firm*—Dicke, Billig & Czaja, PLLC

(57) ABSTRACT

The invention relates to a method and an apparatus for producing a reference voltage that is applied to reference voltage inputs on receiver units in order to discriminate between the logic states of a data signal that is transmitted to a receiver end. A transmission device transmits, in addition to the data signal, a clock signal to the receiver end. The receiver end has, on the output side of a receiver unit that receives the clock signal, an integrator that integrates the clock signal and produces the reference voltage from the integrated value.

21 Claims, 1 Drawing Sheet

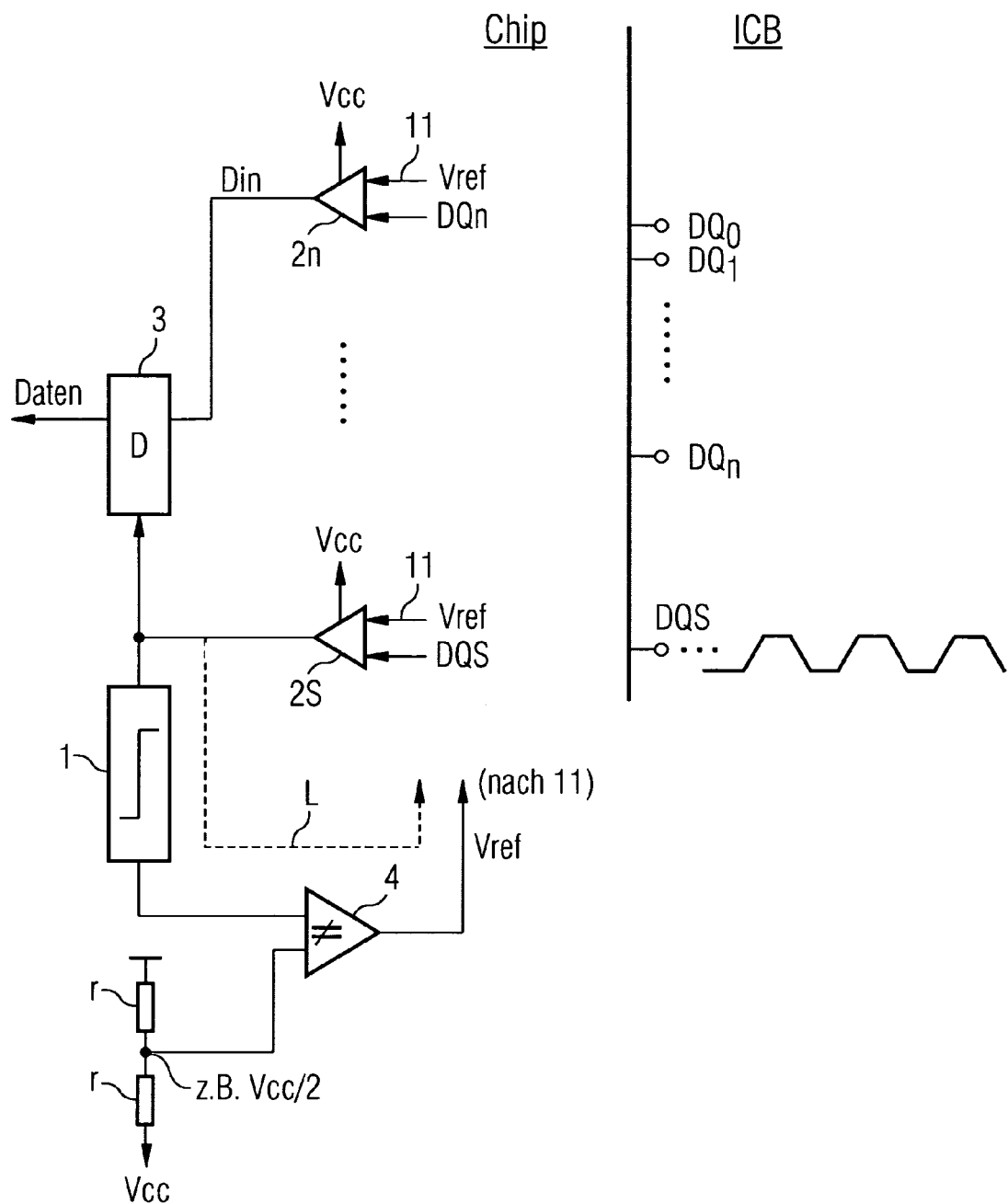

METHOD AND APPARATUS FOR PRODUCING A REFERENCE VOLTAGE

CROSS-REFERENCE TO RELATED APPLICATIONS

This Utility Patent Application claims priority to German Patent Application No. DE 103 31 829.1, filed on Jul. 14, 2003, which is incorporated herein by reference.

BACKGROUND

The invention relates to a method and an apparatus for producing a reference voltage that is applied to reference voltage inputs on receiver units in order to discriminate between the logic states of a data signal that is transmitted to a receiver end. A transmission device transmits, in addition to the data signal, a clock signal to the receiver end. The receiver end has an integrator that integrates the clock signal and produces the reference voltage from the integrated value. Such a method and an apparatus of this kind are known from the earlier German application 102 16 615.3 from Infineon Technologies AG.

In every signal-transmitting system, be it a bi-directional system or a unidirectional system, a driver uses a line or transmission link to send a signal from a first point to a second point, where the signal is received. Similarly, in a bi-directional system, a signal can be sent from a second point to the first point in the transmission link or in the transmission line, where it is likewise received and then decoded. In the simplest case, a receiver unit decodes the signal by converting it into a respective known level according to its logic state. To this end, the output of the receiver unit is switched between the two known signal levels, depending on whether or not the received signal level exceeds a particular threshold value (for example in the form of a reference voltage).

In ordinary systems, the reference voltage Vref is typically produced outside of a chip, is supplied thereto in the form of a predetermined voltage value and is applied to the receiver units therein. Normally, the value of the reference voltage is placed in the center between the received data signal's ideal maximum value and minimum value independently of the leading and trailing edges of the received data signal. However, there are a series of influencing variables that cause the reference voltage Vref to differ from this mean value. Such differences may be brought about by changes in the produced and received reference voltage itself and by the waveform of the received data signals.

By far the most frequent source of influence is differences between the drivers which drive the data signals. In many systems, even the way in which the data signals are terminated causes differences. If the drivers of the data signals have an asymmetrical driver resistance for high and low levels and/or if the terminating resistance results in asymmetrical termination for high and low levels, then the received data signal is not centered about its mean value, that is to say about the value of the reference voltage Vref produced. This results in less than optimum timing tolerances, particularly in DDR memory systems, in which the data signals' leading and trailing edges are expected to be totally symmetrical.

The method described in the aforementioned earlier application DE 102 16 615.3, involves the reference voltage Vref being produced directly by integrating the data strobe signal arriving on the chip. In this case, the problem may arise that if the receiver that uses the reference voltage produced by integration is not operating in optimum fashion, it is not possible to establish that the data signal that is output by the receivers is consequently not optimum. Hence this known method operates correctly only if the receiver using the reference voltage produced is perfect. A perfect receiver would react to the received data precisely at their point of intersection with the reference voltage produced and hence in the same way to rising and falling edges in the data signals. Hence, a perfect receiver of this kind would not change its delay if the reference voltage were to fluctuate. Real receivers are not perfect in this way, however, and therefore do not produce a perfect data output signal having a duty ratio of 50% even when the reference voltage is precisely in the center between an incoming data signal's high and low signal states of respectively equal duration.

SUMMARY

One embodiment of the present invention provides a method and an apparatus for producing a reference voltage of the generic type such that the aforementioned less than perfect properties can be avoided when producing reference voltages. The reference voltage produced results in a desired, for example, 50% duty ratio for the received data signal.

In one embodiment, the method and apparatus use a feedback loop, containing an integrator, that automatically produces a 50% or other desired duty ratio at the receiver output. In this case, the integrator is positioned downstream of the receiver that receives the clock signal. This means that all of the receiver's less than perfect properties are contained in the integrated signal. If an amplifier so requires, the integrated signal is fed back and produces an optimum reference voltage.

The feedback loop contains a comparator which compares the reference voltage produced by the integrator with a reference-ground voltage which is produced, by way of example, by halving the receivers' supply voltage level.

In one embodiment, the received clock signal used to produce the reference voltage is a continuous signal train of low and high signal states and has the same low and high voltage levels as a received data signal. This additionally transmitted clock signal is intended to contain all of the variations brought about by the drivers of the data signals and by the receiver-end termination. Since the clock signal additionally transmitted in order to produce the reference voltage through integration has a constant pulse period duration and a symmetrical succession of low and high clock signal states, for example a signal pattern such as "101010101010" or "1100110011001100", the integrator producing the reference voltage from this clock signal can adaptively align the reference voltage with the data signal's changes brought about by the driver variations and terminating resistance variations by integrating the received clock signal over a certain period of time before the data signal is received.

The integrator's position on the output side of the receiver that receives the additional clock signal means that all of the receiver's shortcomings are contained in the integrated signal. It goes without saying that the differences caused by the circuits situated upstream of the feedback loop can then also be corrected.

In a DDR-DRAM system (used as a system example) transmitting data signals and data strobe signals, the additional clock signal used to produce the reference voltage is the data strobe signal, since it has a continuous signal train of low and high clock signal states, is subject to the same system-related variations as the received data signal, and also has the same low and high voltage levels as a received data signal. If, as required, the integrator integrates the data strobe signal for long enough before the data signal is received, then the integrator can be used to produce the reference voltage as a constant value.

Apart from the aforementioned DQS signal that one embodiment of the invention uses to produce the reference voltage through integration, it is possible to use any other clock signal that satisfies the above conditions and can be integrated over a particular period of time.

If the duty ratio of the additional clock signal used for integration at the output of its receiver is 50%, for example, then the reference voltage produced therefrom is necessarily in the center of the voltage swing. This integrated voltage is then compared, within the feedback loop, with a reference-ground voltage that is produced by halving the supply voltage for the receiver, and only then is it fed back to the reference voltage input of the receiver as a new reference voltage. If the voltage swing at the input of the receiver is different than at the output thereof, the new reference voltage would not be able to be equal to half of the supply voltage for the receivers.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 schematically illustrates an exemplary embodiment of the inventive apparatus with relevant signals in a DDR-DRAM memory system.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the FIGURE(S) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The exemplary embodiment of the inventive apparatus illustrated in FIG. 1 is applied, by way of example, to the production of the reference voltage Vref for receiving data signals DQ transmitted between DDR-DRAM memory chips. The right-hand half of FIG. 1 illustrates an interface on an integrated circuit board ICB for the signals that concern the invention. Data signals DQ0, DQ1, . . . , DQn and a data strobe signal DQS are received. The data signals DQ0, DQ1, . . . , DQn are supplied to receiver units $2n$, $2s$ in the DDR-DRAM DRAM memory chip shown on the left in FIG. 1. The clock or data strobe signal DQS is supplied to a receiver unit $2s$ which is set up in the same way as the receiver units $2n$ which receive the data signals. The data strobe signal DQS produced at the output of the receiver unit $2s$ is applied to an enable input on a data latch (D-type flipflop) 3, which means that the input data Din produced at the output of the receiver units $2n$ are transferred to the data latch 3 in sync with the data strobe signal DQS.

In line with one embodiment of the invention, the output of the receiver unit $2s$ has an integrator 1 connected to it that integrates the data strobe signal DQS that is output by the receiver unit $2s$ over a sufficiently long time before the data signals DQ0, DQ1, . . . , DQn are received. The data strobe signal DQS integrated by the integrator 1 is compared by a comparator 4 with a reference-ground voltage Vcc/2, which is formed by a voltage divider (which in the simplest case is formed from two voltage divider resistors r of equal magnitude) by halving the supply voltage Vcc that is applied to the receiver units $2n$, . . . , $2s$. The new reference voltage Vref produced at the output of the comparator 4 is then supplied to the reference voltage inputs 11 of the receiver units $2n$, . . . , $2s$. The integrator 1 and the comparator 4 form a feedback loop L.

If the duty ratio at the output of the receiver unit $2s$ is equal to 50%, for example, then the reference voltage level produced by the integrator 1 is in the center of the voltage swing.

The feedback loop L formed in accordance with one embodiment of the invention corrects all less than perfect properties in the data transmitters, the terminations and the receiver units, and downstream of the feedback loop L a signal having a 50% duty ratio or other duty ratios is produced. This means that, upstream of the feedback loop L, other circuits may also be included whose less than perfect properties are thus likewise corrected.

It should be mentioned that, instead of the data strobe signal DQS, which is appropriate as additional clock signal in one embodiment of the invention for DDR-DRAM memory systems, the reference voltage Vref may also be produced by using and integrating any other clock signal that is available in the system, provided that it is subject to the same system-related variations as the received data signal DQ and can be integrated over a particular period of time before the data signal DQ is received.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a reference voltage comprising:
   transmitting a data signal to a first receiver;
   transmitting a clock signal to a second receiver;
   discriminating the clock signal with the reference voltage at the second receiver to produce an output clock signal;

integrating the output clock signal on an output side of the second receiver to produce an integrated value;

producing the reference voltage from the integrated value in order to level-discriminate between logic states of the data signal; and applying the reference voltage to reference voltage inputs on the first and second receivers.

2. The method of claim 1, wherein the integrated value is compared, before being applied to the reference voltage inputs, with a reference-ground voltage that is produced by halving a supply voltage for the first and second receivers.

3. The method of claim 1, wherein the received clock signal is a continuous signal train of low and high signal states.

4. The method of claim 3, wherein the received clock signal has the same low and high voltage levels as a received data signal.

5. The method of claim 3, wherein the received clock signal is subject to the same system-related variations at the receiver end as the received data signal.

6. The method of claim 1, wherein the clock signal is driven by the same type of driver amplifiers as the data signal.

7. The method of claim 1, wherein the clock signal is integrated during a particular period of time before the data signal is received.

8. The method of claim 1, wherein the data strobe signal in the case of data transmission to and from DDR-DRAM chips is used as the clock signal.

9. The method of claim 8, wherein the received data signal is integrated at least on every DDR-DRAM chip.

10. The method of claim 9, wherein the data signal is additionally integrated in a memory controller chip which receives the data.

11. An apparatus for producing a reference voltage that is applied to reference voltage inputs on first and second receiver units in a receiver end in order to level-discriminate between logic states of a data signal in the case of the first receiver unit, and a clock signal in the case of the second receiver unit, both sinals transmitted to the receiver end, the apparatus comprising:

a transmission device for transmitting the data signal and thee clock signal to the receiver end;

an integrator in the receiver end that integrates the level-discriminated clock signal and produces the reference voltage from the integrated value; and wherein the integrator is provided on an output side of the second receiver unit, which receives the clock signal.

12. The apparatus of claim 11, wherein a feedback loop routed from an output of the integrator to the reference voltage inputs of the first and second receiver units contains a comparator that compares the integrated value with a reference-ground voltage produced by halving the supply voltage level for the receiver units.

13. The apparatus of claim 12, wherein the transmitted clock signal has a continuous succession of low and high clock signal states of respectively equal duration and constant period.

14. The apparatus of claim 13, wherein the transmitted clock signal has the same low and high voltage levels at the receiver end as a received data signal and is subject to the same system-related variations as the received data signal.

15. The apparatus of claims 14 used for producing the reference voltage for the data reception of data transmitted between DDR-DRAM chips, wherein the transmitted clock signal is a data strobe signal.

16. The apparatus of claim 15, wherein the integrator integrates the level-discriminated data strobe signal during a particular period of time before the data signal is received.

17. An apparatus for level-discriminating between logic states of a data signal and a clock signal both transmitted to a receiver, the apparatus comprising:

a first receiver unit in the receiver end having a first and a second input, the first input receiving the data signal and the second input receiving a reference voltage to level-discriminate between logic states of the received data signal;

a second receiver unit in the receiver end having a first and a second input and an output, the first input receiving the clock signal, the second input receiving the reference voltage to level-discriminate between logic states of the received clock signal and the output producing an output signal;

an integrator coupled to the output of the second receiver unit such that it integrates the output signal and produces an integrated value therefrom; and wherein the reference voltage is produced from the integrated value.

18. The apparatus of claim 17, wherein a feedback loop routed from an output of the integrator to the second input of the first and second receiver units contains a comparator that compares the integrated value with a reference-round voltage produced by halving the supply voltage level for the receiver units.

19. The apparatus of claim 18, wherein the transmitted clock signal has a continuous succession of low and high clock signal states of respectively equal duration and constant period.

20. The apparatus of claim 19, wherein the transmitted clock signal has the same low and high voltage levels at the receiver end as a received data signal and is subject to the same system-related variations as the received data signal.

21. The apparatus of claim 17, wherein the integrator integrates the output signal of the second receiver unit during a particular period of time before the data signal is received.

* * * * *